United States Patent
Matsuzaki et al.

(10) Patent No.: US 7,915,073 B2
(45) Date of Patent: Mar. 29, 2011

(54) METHOD OF MANUFACTURING THE ORGANIC ELECTROLUMINESCENT DISPLAY AND ORGANIC ELECTROLUMINESCENT DISPLAY MANUFACTURED BY THE METHOD

(75) Inventors: Eiji Matsuzaki, Yokohama (JP); Keiji Takanosu, Yokohama (JP); Hiroyasu Matsuura, Yokohama (JP)

(73) Assignee: Hitachi Displays, Ltd., Chiba (JP)

( * ) Notice: Subject to any disclaimer, the term of this patent is extended or adjusted under 35 U.S.C. 154(b) by 1142 days.

(21) Appl. No.: 11/521,308

(22) Filed: Sep. 15, 2006

(65) Prior Publication Data

US 2007/0072337 A1    Mar. 29, 2007

(30) Foreign Application Priority Data

Sep. 27, 2005    (JP) ................................. 2005-279225

(51) Int. Cl.
    H01L 51/40    (2006.01)
(52) U.S. Cl. ........... 438/99; 257/E51.001; 257/E51.002; 257/E25.008; 257/E25.009; 438/69; 118/720
(58) Field of Classification Search .................... 438/69, 438/99; 118/720; 257/E51.001, E51.002, 257/E25.008, E25.009
    See application file for complete search history.

(56) References Cited

U.S. PATENT DOCUMENTS

| 2005/0053720 A1* | 3/2005 | Yamazaki et al. | 427/69 |
| 2005/0153472 A1* | 7/2005 | Yotsuya | 438/29 |
| 2005/0233489 A1* | 10/2005 | Nishikawa et al. | 438/34 |
| 2006/0081184 A1* | 4/2006 | Yeh | 118/720 |

FOREIGN PATENT DOCUMENTS

| JP | 2002-047560 | 7/2000 |
| JP | 2002-075638 | 8/2000 |
| JP | 2003-059671 | 8/2001 |
| JP | 2003-213401 | 1/2002 |
| JP | 2003-253434 | 3/2002 |
| JP | 2004-079349 | 8/2002 |
| JP | 2004-146251 | 10/2002 |
| JP | 2004-071554 | 7/2003 |

* cited by examiner

*Primary Examiner* — Eugene Lee
*Assistant Examiner* — Peniel M Gumedzoe
(74) *Attorney, Agent, or Firm* — Stites & Harbison PLLC; Juan Carlos A. Marquez, Esq.

(57) ABSTRACT

The present invention provides an organic EL display panel manufacturing method which is capable of forming a desired organic film or the like with high accuracy without imparting damages to a substrate and an organic film and an organic EL display panel which is manufactured by the method. An opening portion which corresponds to a panel pattern region of a display panel is formed in a vapor deposition mask. The opening portion has a bottom surface in the inside of a recessed surface which is retracted from a surface on which the vapor deposition mask is brought into contact with the substrate. The opening portion of the vapor deposition mask is spaced apart from the substrate with a predetermined gap space and evaporated particles from an evaporating source are vapor-deposited to the substrate through the opening portion.

11 Claims, 14 Drawing Sheets

METHOD OF MANUFACTURING THE ORGANIC ELECTROLUMINESCENT DISPLAY AND ORGANIC ELECTROLUMINESCENT DISPLAY MANUFACTURED BY THE METHOD

CROSS-REFERENCE TO RELATED APPLICATION

The disclosure of Japanese Patent Application No. JP2005-279225 filed on Sep. 27, 2005 including the claims, the specification, the drawings and the abstract is incorporated herein by reference in its entirety.

BACKGROUND OF THE INVENTION

1. Field of the Invention

The present invention relates to an organic EL display panel, and more particularly, to an organic EL display panel which is suitable for a method for manufacturing an organic thin film or an electrode film such as a light emitting layer on a substrate by vapor deposition using a vapor deposition mask in a predetermined pattern. The present invention is also characterized by the structure of the vapor deposition mask for such vapor deposition.

2. Description of the Related Art

FIG. 15 is a schematic view of a method of manufacturing an organic EL display panel for explaining a method for forming an organic film such as a light emitting layer using a vapor deposition mask. In FIG. 15, a substrate 101 is a TFT substrate which constitutes an organic EL display panel. The substrate is usually formed of a glass plate. To a main surface (a surface on which an organic light emitting layer is formed) side of the substrate 101, a vapor deposition mask 102 having opening portions 103 is adhered by vapor deposition. The vapor deposition is performed by adhering a magnet plate 104 to a back surface (a surface opposite to the main surface) of the substrate 101 and by attracting the vapor deposition mask 102 which is made of magnetic metal.

In a state that the vapor deposition mask 102 is adhered to the substrate 101, a vapor-deposition particle flow which is vaporized from a vapor deposition source 105 is vapor-deposited to the substrate 101 through the opening portion 103 formed in the vapor deposition mask 102 thus forming a thin film layer 107 made of an organic material. Here, the thin film layer 107 is also formed on a surface of the vapor deposition mask 102 other than the opening portion 103.

However, it is difficult to completely adhere the vapor deposition mask 102 to the whole surface of the substrate 101 and hence, damages on the substrate 101 attributed to a contact of the substrate 101 with the vapor deposition mask 102 and the influence of foreign substances on the contact surface are large. These largely hamper the application of the mask vapor deposition to the mass production of OLED.

With respect to the formation of OLED film on the organic EL substrate by this type of mask deposition, Patent Document 1, Patent Document 2, Patent Document 3, Patent Document 4, Patent Document 5, Patent Document 6, Patent Document 7, and Patent Document 8 are named. In Patent Document 1, Patent Document 2, Patent Document 3 and Patent Document 4 disclose a method which performs the vapor deposition by adhering the substrate and the vapor deposition mask by a magnetic force. On the other hand, Patent Document 5, Patent Document 6, Patent Document 7 and Patent Document 8 disclose a method which reduces a contact area of the substrate and the vapor deposition mask by making a surface of the substrate or the vapor deposition mask rough by applying projections, ribs or irregularities to substrate or the vapor deposition mask thus decreasing damages on the substrate attributed to the contact of substrate and the vapor deposition mask.

Patent Document 1: JP-A-2004-146251
Patent Document 2: JP-A-2004-79349
Patent Document 3: JP-A-2002-47560
Patent Document 4: JP-A-2002-75638
Patent Document 5: JP-A-2004-71554
Patent Document 6: JP-A-2003-59671
Patent Document 7: JP-A-2003-213401
Patent Document 8: JP-A-2003-253434

SUMMARY OF THE INVENTION

In the conventional method which vapor-deposits the organic film such as the light emitting layer of the organic EL to the predetermined portion of the substrate by adhering the vapor deposition mask to the substrate, there have been drawbacks such as (1) the vapor deposition mask is adhered to the substrate and hence, the formed organic film such as the OLED film is easily damaged, (2) the vapor deposition mask is continuously formed on the substrate and the vapor deposition mask and hence, when film peeling-off is generated at the time of peeling off the vapor deposition mask and the substrate from each other and this peeling-off generates foreign substances, (3) the substrate and the vapor deposition mask are easily influenced by difference in thermal expansion coefficient between the substrate and the vapor deposition mask and hence, the substrate and the vapor deposition mask rub each other thus generating damages and foreign substances, and (4) it is difficult to completely adhere the vapor deposition mask to the whole substrate and hence, it is often the case that the distribution of vapor-deposition accuracy in the inside of the substrate is increased or a fine pattern portion is twisted.

Among the countermeasures which are disclosed in the above-mentioned Patent Documents, the method which forms the ribs or the projections on the substrate pushes up a manufacturing cost of the substrate. On the other hand, a mechanical damage reduction effect is small. In the method which forms irregularities on a surface of the vapor deposition mask, the preparation of the vapor deposition mask is difficult and hence, it is difficult to ensure the accuracy of vapor-deposition pattern. In both methods, the substrate and the vapor deposition mask are adhered to each other in an effective area of the display panel and hence, it is difficult to suppress the generation of damages and foreign substances of the organic film such as the OLED film on the portion. Here, although there has been also known a method which performs the vapor deposition while separating the vapor deposition mask and the substrate from each other, it is extremely difficult to align the vapor deposition mask and the substrate in this method.

Accordingly, it is an object of the present invention to provide a method of manufacturing an organic EL display panel which can form a desired organic film or the like with high accuracy without damaging the substrate or the organic film and an organic EL display panel which is manufactured by the method.

Inventors of the present invention have found out, in a process of developing a vapor deposition mask for forming an organic film such as an OLED film, that it is possible to obtain the mask vapor deposition which is similar to the proximity exposure in an exposure step of a photolithography process by improving the structure in the plate-thickness direction of a mask forming base-material sheet which is used for the vapor deposition mask. The present invention has been made based on such finding.

The present invention is directed to a vapor deposition mask which can form a large number of small-sized display panel from one large-sized base substrate. Although a vapor deposition mask and the substrate are adhered to each other basically, an organic thin film such as an OLED film is vapor-deposited without bringing the vapor deposition mask and the substrate into contact with each other in a region where each display panel exists.

The vapor deposition mask used in the manufacture of the organic EL display panel of the present invention is configured such that the vapor deposition mask is not brought into contact with the substrate by providing a recessed surface which retracts from a surface of the substrate to the vapor deposition mask which faces a region where the display panel is formed. An opening portion necessary for vapor-depositing an organic thin film such as a light emitting layer of an OLED is formed in a region which constitutes a bottom surface in the inside of the recessed surface.

A method of manufacturing an organic EL display panel of the present invention is directed to a method of manufacturing an organic EL display element in which a vapor deposition mask having opening portions in a predetermined pattern is adhered to a surface of a substrate which constitutes an organic EL display panel, and a thin film pattern corresponding to the predetermined pattern is formed on a surface of the substrate through the opening portions of the vapor deposition mask by means of a thin film layer forming means, wherein the opening portion of the vapor deposition mask is formed on a bottom surface in the inside of a recessed surface which is retracted from a surface on which the vapor deposition mask is brought into contact with the substrate, and the thin film pattern is vapor-deposited by making the opening portion of the vapor deposition mask spaced apart from the substrate with a predetermined gap.

An organic EL display panel of the present invention is formed by sequentially stacking at least one electrode, an organic layer which includes a light emitting layer and another electrode to a substrate. The organic layer is formed such that a vapor deposition mask having an opening portion corresponding to a pattern of the organic layer is adhered to a surface of the substrate, and the organic layer is formed corresponding to the predetermined pattern on a surface of the substrate through the opening portions of the vapor deposition mask by means of a thin film layer forming means, and the opening portion of the vapor deposition mask is formed in the inside of a recessed surface which is retracted from a surface to which the vapor deposition mask is brought into contact with the substrate, and the opening portion of the vapor deposition mask is formed using a method which vapor-deposits the organic layer spaced apart from the substrate with a predetermined gap.

The present invention is not limited to the constitution described in claim sand the constitutions disclosed in respective embodiments described later and various modifications are considered without departing from the technical concept of the present invention.

The vapor deposition mask and a printed circuit board are not adhered to each other at the portion of the substrate on which the light emitting layer pattern of the OLED is formed and hence, a thin film such as the light emitting layer of the OLED or the like which is formed on the substrate is not damaged by the vapor deposition mask. Accordingly, it is possible to suppress the deterioration of properties of the thin film such as the light emitting layer such as the OLED or the like attributed to the vapor deposition mask.

By preventing a contact between the previously formed thin film such as the light emitting layer of the OLED or the like and the vapor deposition mask, it is possible to suppress the generation of foreign substances by peeling-off attributed to the contact in alignment. Accordingly, a manufacturing yield can be enhanced.

Since the thin film layer on the substrate and the thin film layer on the vapor deposition mask are not formed contiguously, it is possible to suppress the generation of foreign substances attributed to the peeling-off at the time of peeling the vapor deposition mask and the substrate from each other by pulling.

The vapor deposition mask is present between an evaporation source and the substrate thus decreasing a contact surface between the substrate and the vapor deposition mask and hence, it is possible to suppress the elevation of temperature of the substrate. Accordingly, by preparing the vapor deposition mask using a low thermal expansion material, it is possible to suppress the positional displacement between the vapor deposition mask pattern and the printed circuit board in the vapor deposition step. In this manner, the organic EL display panel hardly receives the influence of heat radiation from the evaporation source and hence, it is possible to increase the accuracy of alignment between the vapor deposition mask and the substrate. Further, since the vapor deposition mask is not brought into contact with a film forming surface, it is possible to suppress an abnormal discharge or the like attributed to the film formation whereby the present invention is also applicable to the film formation by sputtering and the film formation by a CVD method.

In this manner, according to the present invention, damages on the OLED layer are eliminated and, at the same time, the generation of foreign substances can be suppressed and hence, the present invention largely contributes to the enhancement of properties, the enhancement of a yield rate and the reduction of a manufacturing cost of a product.

DETAILED DESCRIPTION OF THE INVENTION

Hereinafter, embodiments of the present invention are explained in conjunction with drawings showing embodiments.

Embodiment 1

Figure 1:
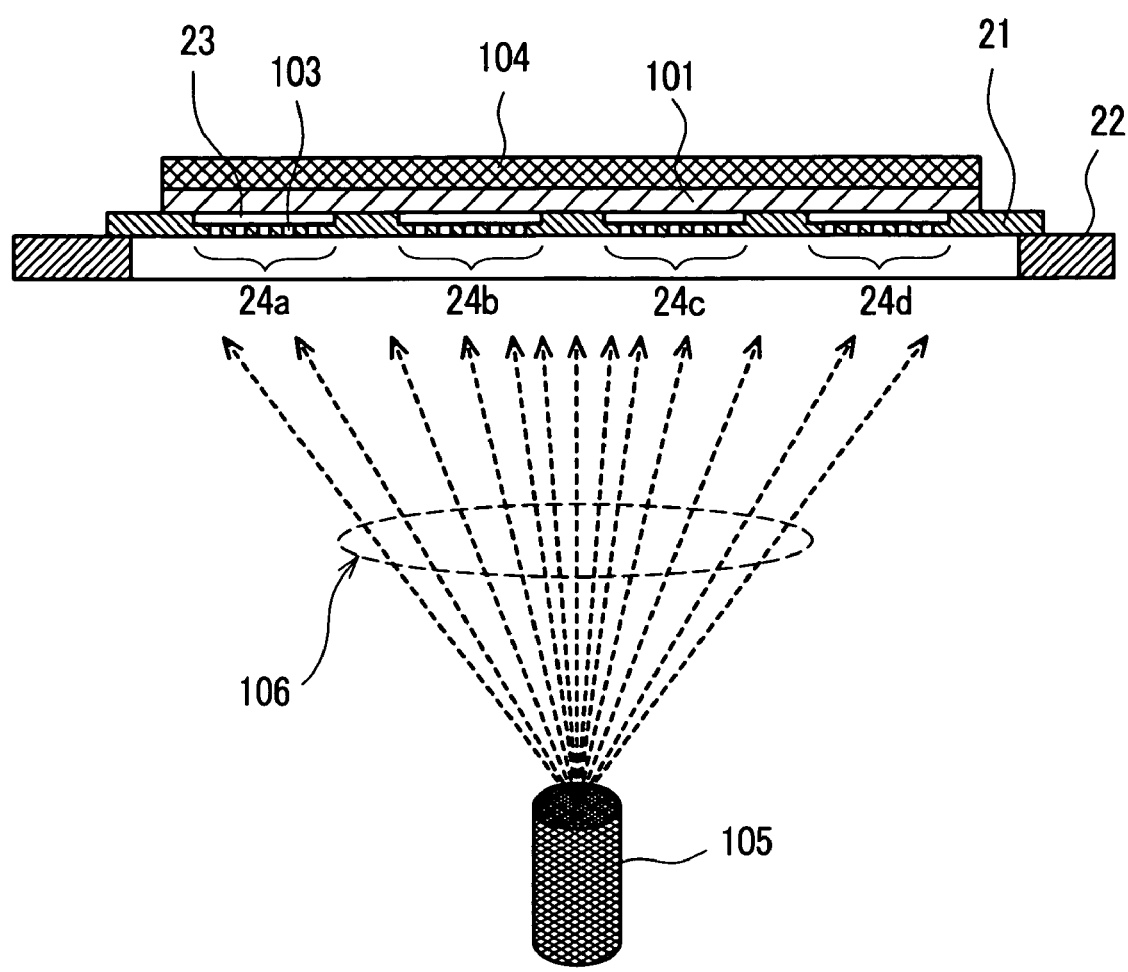
FIG. 1 is a schematic view for explaining an embodiment 1 of a method of manufacturing an organic EL display panel according to the present invention.

FIG. 1 a schematic view for explaining an embodiment 1 of a method of manufacturing an organic EL display panel according to the present invention. A substrate 101 is a TFT substrate which constitutes the organic EL display panel and is a base substrate which is formed of a glass plate. Here, it is assumed that n×m pieces of small-sized panels, that is, individual organic EL display panels (also simply referred to as a display panel) in which n pieces (four in FIG. 1) of display panels are arranged in the lateral direction on this paper and m pieces of display panels are arranged in the direction perpendicular to this paper are manufactured from the substrate 101. In FIG. 1, an effective area of the display panel is indicated as panel pattern portions 24 (24a, 24b, 24c, 24d).

The vapor deposition is performed in a state that a vapor deposition mask 21 having opening portions 103 is arranged on a main surface side of the substrate 101. In the embodiment 1, the vapor deposition mask 21 is fixed to a mask frame 22 by an adhesive agent or by welding. The opening portions 103 of the vapor deposition mask 21 are formed in bottom surfaces in the inside of recessed surfaces which are retracted from a surface of the substrate 101 thus forming gap spaces (gaps) 23 between the substrate 101 and the bottom surfaces. The vapor deposition mask 21 and the substrate 101 are adhered to each other except for the gap spaces 23.

A vapor deposition particle flow 106 which is evaporated from an evaporation source 105 is vapor-deposited to the main surface of the substrate 101 through the opening portions 103 formed in the respective panel pattern portions 24 (24a, 24b, 24c, 24d) of the vapor deposition mask 21 and forms a thin film layer made of an organic material. Here, the thin film layer formed between the vapor deposition mask and the substrate is omitted from FIG. 1.

As a constitutional material of the mask frame 22, iron-based alloy such as Invar or 42-alloy or a material which contains aluminum as a main content may be used. Among these materials, the constitutional material of the mask frame 22 is selected by taking materials of the substrate 101 on which a film is formed and the vapor deposition mask 21 into consideration.

The magnet plate 104 performs a function of adhering the vapor deposition mask 21 and the substrate 101. In this case, the vapor deposition mask 21 which is wholly or partially made of a magnetic material is used.

Figure 2:
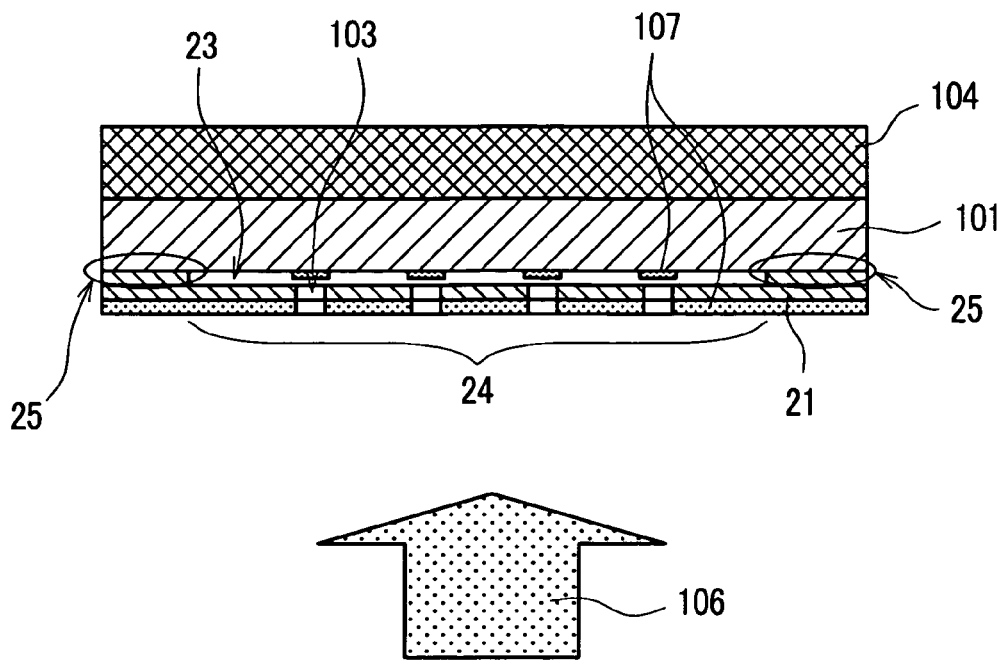
FIG. 2 is an enlarged cross-sectional view of a panel pattern portion of the display panel for explaining a first constitutional example of a vapor deposition mask.
Figure 3:
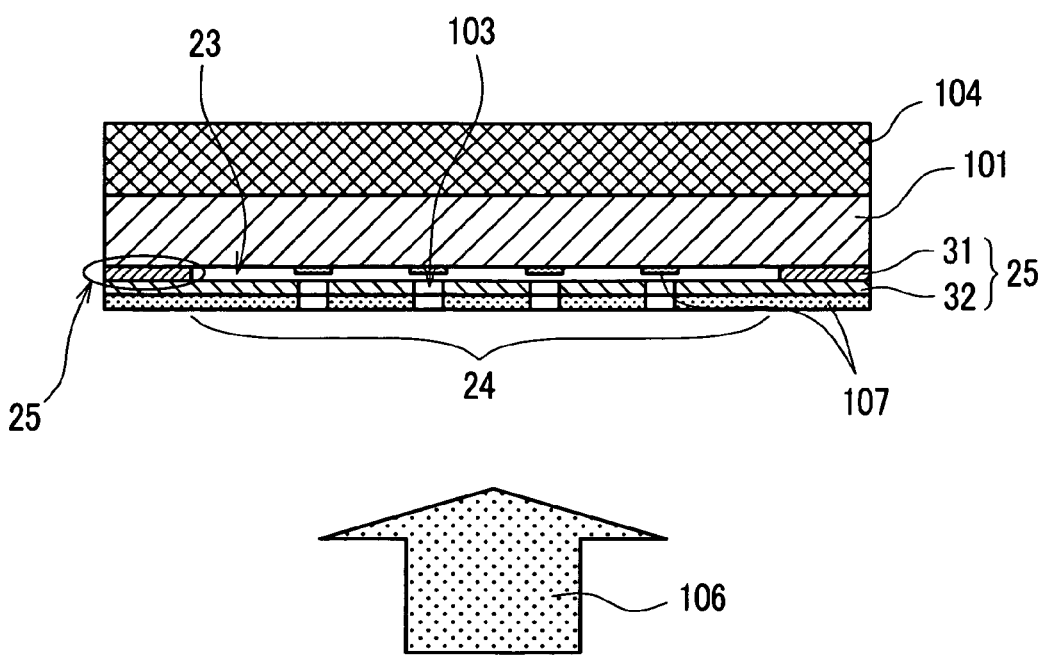
FIG. 3 is an enlarged cross-sectional view of a panel pattern portion of the display panel similar to FIG. 2 for explaining a second constitutional example of a vapor deposition mask.
Figure 4:
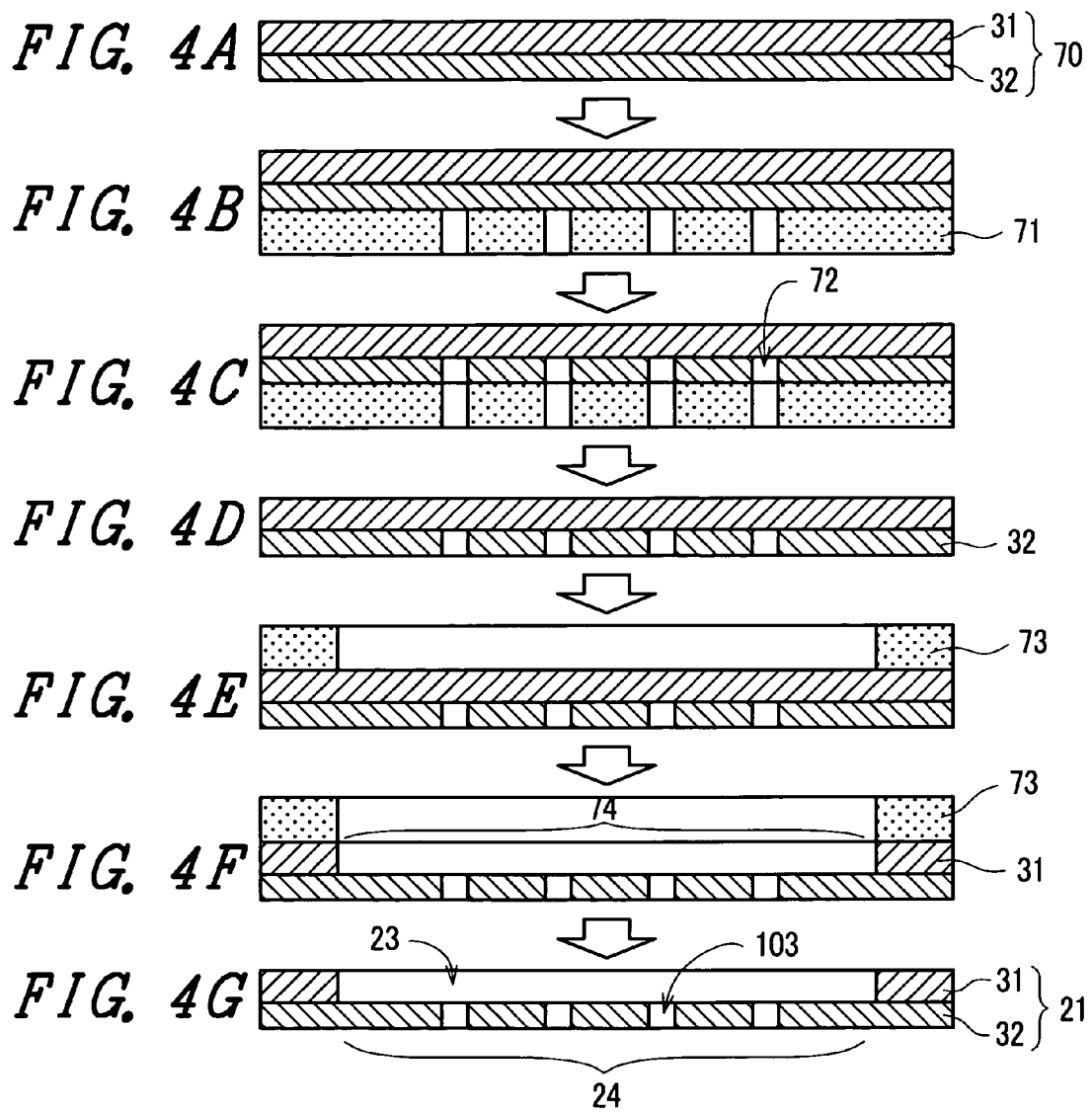
FIG. 4 is a view for explaining one example of a manufacturing process of a vapor deposition mask having the panel pattern portion shown in FIG. 3.
Figure 5:
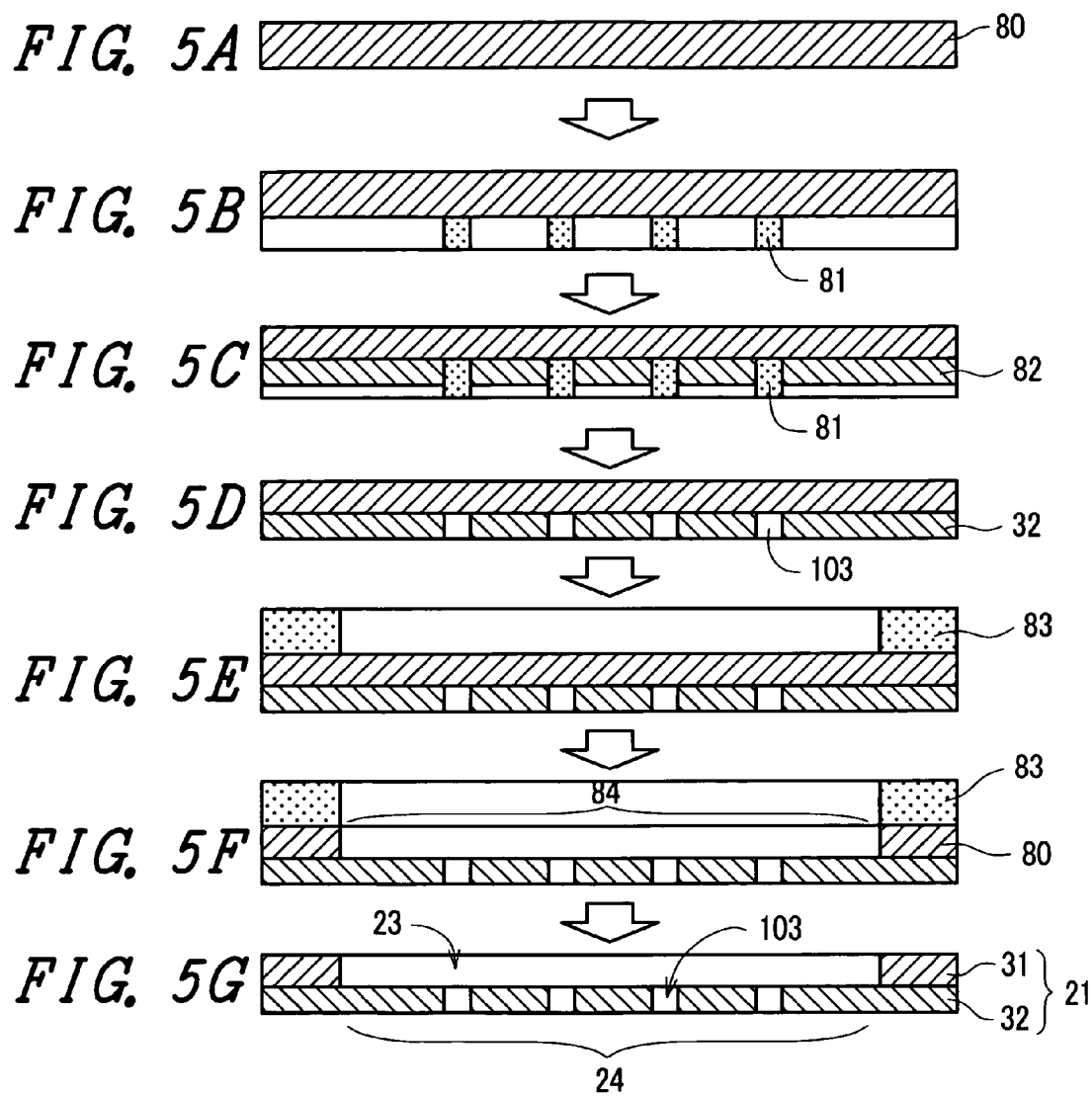
FIG. 5 is a view for explaining another example of a manufacturing process of the vapor deposition mask having the panel pattern portion shown in FIG. 3.
Figure 6:
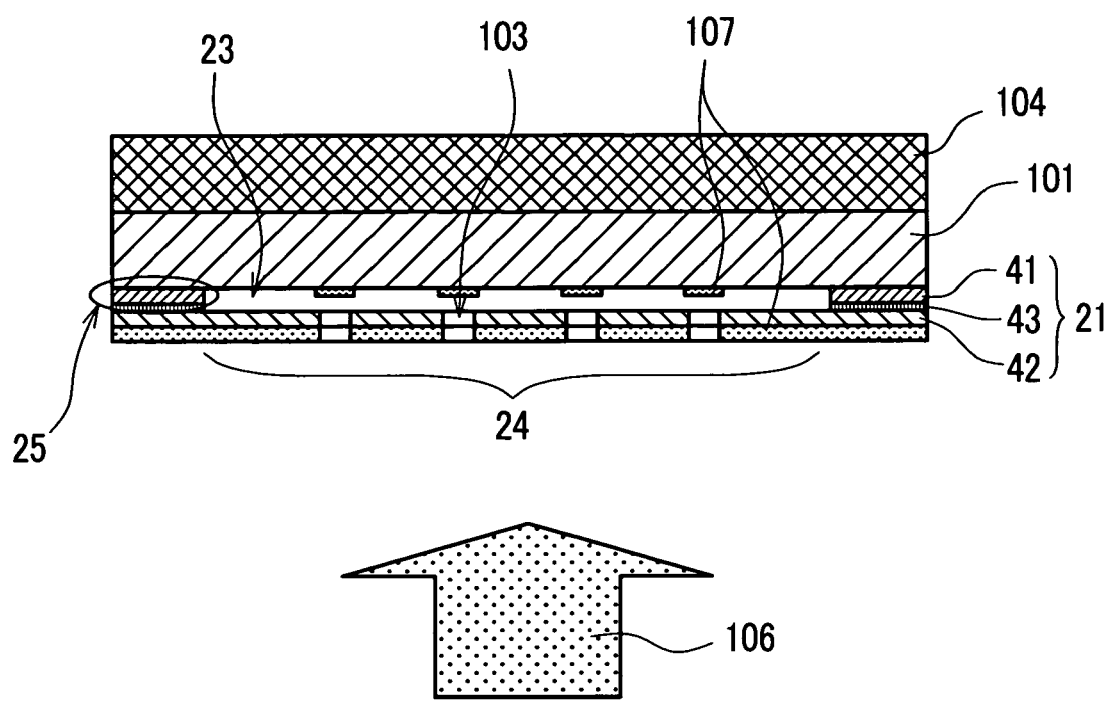
FIG. 6 is an enlarged cross-sectional view of a panel pattern portion of the display panel similar to a display panel shown in FIG. 2 or FIG. 3 for explaining a third constitutional example of a vapor deposition mask.
Figure 7:
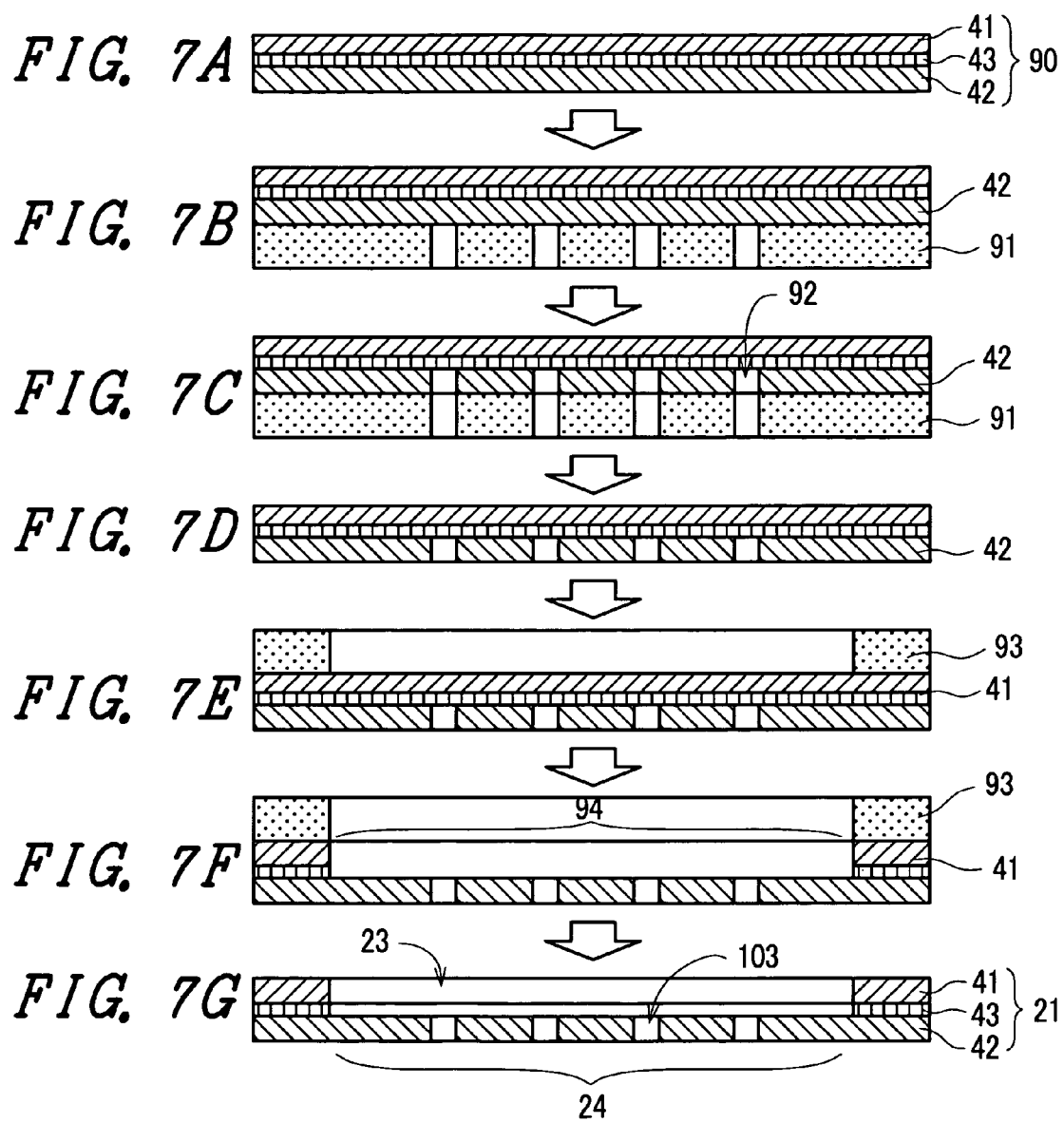
FIG. 7 is a view for explaining manufacturing steps of the vapor deposition mask having the display panel forming portion shown in FIG. 6.

FIG. 2, FIG. 3 and FIG. 6 are enlarged cross-sectional views of the panel pattern portion 24 of the display panel which is formed by the vapor deposition mask 21 shown in FIG. 1 and show various structural examples in the plate-thickness direction of the vapor-deposition mask according to the present invention. Further, FIG. 4, FIG. 5 and FIG. 7 are explanatory views of manufacturing processes of respective vapor deposition masks having the structures shown in FIG. 2, FIG. 3 and FIG. 6.

Although the vapor deposition mask 21 and the substrate 101 are basically adhered to each other, in the panel pattern portion 24 (24a to 24d) which forms the effective region of the display panel of the vapor deposition mask 21, the gap space 23 is formed between the vapor deposition mask 21 and the substrate 101 thus preventing a contact between the vapor deposition mask 21 and the substrate 101 in the panel pattern portion 24 (24a to 24d).

The opening portions 103 for forming an organic layer pattern are formed in the panel pattern portion 24 (24a to 24d) which forms the gap space 23 of the vapor deposition mask 21. Organic thin film layers 107 are formed through the opening portions 103. Accordingly, the organic thin film layers 107 and the vapor deposition mask 21 which are formed on the substrate 101 are not brought into contact with each other.

Accordingly, no mechanical damages attributed to the vapor deposition mask 21 are generated on the organic thin film layers 107 which are formed on the substrate 101. Further, since the organic thin film layers 107 on the substrate 101 and the organic thin film layers 107 on the vapor deposition mask 21 are not formed contiguously and hence, it is also possible to suppress the generation of foreign substances attributed to the film peeling-off when the vapor deposition mask 21 and the substrate 101 are peeled off from each other by pulling.

Due to the radiation heat from the evaporation source 105, temperatures of the vapor deposition mask 21 and the substrate 101 are elevated. However, the vapor deposition mask 21 and the substrate 101 are not brought into contact with each other at the panel pattern portion 24 which constitutes the display panel forming portion (that is, the effective region forming portion of the display panel) and hence, a contact area between the vapor deposition mask 21 and the substrate 101 is small whereby it is possible to minimize the elevation of temperature of the subtrate 101. Further, by forming the vapor deposition mask 21 using a low thermal expansion material (Invar, super-Invar or the like), it is possible to suppress the positional displacement between the vapor deposition mask 21 and the subtrate 101. For example, when the substrate 101 is made of alkali-free glass and the vapor deposition mask 21 is made of Invar, the thermal coefficient difference of 3 ppm/° C. is generated. However, by setting the temperature of the subtrate 101 lower than the temperature of the vapor deposition mask 21 by approximately 3° C. it is possible to suppress the positional displacement attributed to the temperature elevation.

The first constitutional example of the vapor deposition mask shown in FIG. 2 is formed of a single member. As a material which constitutes the vapor deposition mask 21, iron-nickel-based alloy, nickel or the like can be used. The vapor deposition mask 21 may be manufactured by etching or a plating method. A tension is applied to the member 32 which constitutes a display panel forming portion, that is, the panel pattern portion 24 so as to prevent the slackening of the display panel forming portion.

Although the organic thin film layer 107 is formed on the substrate 101 and the vapor deposition mask 21, the organic thin film layer 107 is not formed contiguously on the substrate 101 and the vapor deposition mask 21 respectively and hence, there is no possibility of film cutting at the time of separating the vapor deposition mask 21 from the substrate 101 by pulling whereby the generation of foreign substances can be prevented.

Since it is necessary to make the substrate 101 and the vapor deposition mask 21 adhere to each other at the contact portions 25, the vapor deposition mask 21 is formed of the magnetic material and is attracted to the magnetic plate 104 which is mounted on a back surface of the substrate 101. Due to such a method, the substrate 101 and the vapor deposition mask 21 can be adhered to each other by the magnetic plate 104 and hence, it is possible to prevent the displacement of the substrate 101 and the vapor deposition mask 21 whereby the alignment accuracy of the substrate 101 and the vapor deposition mask 21 can be enhanced.

FIG. 3 is an enlarged cross-sectional view of a panel pattern portion of the display panel similar to FIG. 2 for explaining a second constitutional example of a vapor deposition mask. FIG. 3 also enlarges the display panel forming portion in the inside of the vapor deposition mask 21 in FIG. 1, that is, the panel patterning portion 24 and shows a constitutional example in the plate thickness direction of the vapor deposition mask 21.

The vapor deposition mask 21 has the stacked structure formed of two members 31, 32. Although the first member 31 and the second member 32 are selectively made of iron-based alloy such as Invar or 42-alloy, nickel alloy or the like, the combination of materials is selected by taking the specification and formability that the vapor deposition mask is required to satisfy into consideration.

Although the vapor deposition mask shown in FIG. 3 can obtain the same advantageous effects as the vapor deposition mask having the constitution shown in FIG. 2, the vapor deposition mask shown in FIG. 3 can also obtain a following advantageous effect by adjusting materials of two members 31, 32. That is, by forming two members 31, 32 using materials which allow the selective etching thereof, it is possible to set the forming accuracy of the gap space 23 and the opening portion 103 higher than the constitutional example shown in FIG. 2. As an example of such a combination, the combination of nickel-based alloy which contains nickel as a main content and iron-based alloy (Invar, 42-alloy or the like) which contains iron as a main component is known.

A portion (a contact portion 25) where the substrate 101 and the vapor deposition mask 21 are adhered to each other may be formed of a magnetic material and a portion of the vapor deposition mask 21 which faces the gap space 23 may be formed of a non-magnetic material. Due to such a constitution, it is possible to increase the adhesiveness of the substrate 101 and the vapor deposition mask 21 while suppressing the deflection and the deformation of the display panel forming portion 24 attributed to the magnet 104. The structure of the gap space 23 is formed of a recessed surface portion which is retracted from a surface of the substrate 101 by an amount of thickness of the first member 31 and opening portions 103 are formed in a bottom surface of the recessed surface portion.

By setting a thermal expansion coefficient of the portion of the vapor deposition mask 21 which faces the gap space 23 smaller than a thermal expansion coefficient of the portion where the substrate 101 and the vapor deposition mask 21 are adhered to each other, it is possible to prevent the deformation or the slackening of the vapor deposition mask 21 at the small-sized panel forming portion 24 attributed to the elevation of temperature. As one example of the combination, the second member 32 is made of Invar and the first member 31 may be made of 42-alloy.

FIG. 4 is a view for explaining one example of a manufacturing process of a vapor deposition mask having the panel pattern portion shown in FIG. 3. The vapor deposition mask is manufactured in order of steps (A)→(B)→(C)→(D)→(E)→(F)→(G).

(A) . . . A surface of a mask sheet member 70 which is formed of a first member 31 (Invar or super Invar) and a second member 32 (42-alloy) is made flat and smooth by polishing or the like. A plate thickness of the member 31 is set to 0.005 mm and a plate thickness of the member 32 is set to 0.015 to 0.050 mm.

(B) . . . A predetermined resist pattern 71 is formed on the second member 32. A resist material may be either a dry film or a liquid resist. In forming the resist pattern, a well-known photolithography method may be used. Here, a protective film (not shown in the drawing) made of an organic material may be formed on a surface of the first member 31.

(C) . . . The second member 32 is formed by spray etching using an etchant containing ferric chloride as a main component, for example, to form opening portions 72 therein.

(D) . . . The resist pattern 71 which is formed on the second member 32 and the protective film (not shown in the drawing) which is formed on the first member 31 are removed using a peeling liquid.

(E) . . . A predetermined resist pattern 73 is formed on the first member 31. A resist material may be either a dry film or a liquid resist. The resist pattern may be formed in the same manner as step (B). Here, a protective film (not shown in the drawing) made of an organic material may be formed on a surface of the second member 32.

(F) . . . The first member 31 is formed by spray etching using an etchant containing ferrite chloride as a main component, for example, to form opening portions 74 therein.

(G) . . . The resist pattern 73 and the protective film (not shown in the drawing) which are formed on the second member 32 are removed using a peeling liquid.

Due to such a manufacturing process, the vapor deposition mask 21 shown in FIG. 3 is completed. Between the vapor deposition mask 21 and the substrate 101, gap space 23 and the opening portions 103 for forming the vapor deposition pattern are formed.

FIG. 5 is a view for explaining another example of the manufacturing process of the vapor deposition mask having the panel pattern portion shown in FIG. 3. The vapor deposition mask is manufactured in order of steps (A)→(B)→(C)→(D) (E)→(F)→(G).

This manufacturing method is characterized by combining a plating method and an etching method. Here, although the member 32 is formed by the plating method and the first member 31 is formed by the etching method, the members 31, 32 may be formed in an opposite manner.

(A) . . . A surface of a mask sheet base member 80 which is made of Invar or the like is made flat or leveled by polishing or the like. A plate thickness of the mask sheet base member 80 is set to 0.005 to 0.050 mm, for example, by taking a mechanical strength and dimensional accuracy of the vapor deposition mask into consideration.

(B) . . . A predetermined resist pattern 81 is formed on one main surface of the mask sheet base member 80. A resist material may be either a dry film or a liquid resist. In forming the resist pattern, in the same manner as the previously-mentioned method, a well-known method may be used. Here, a protective film (not shown in the drawing) made of an organic material may be formed on another surface of the mask sheet base member 80. The protective film prevents the formation of a plating layer to a protective film forming surface in step (C).

(C) . . . A plating layer 82 which contains nickel (Ni) as a main content is formed by a well-known plating method.

(D) . . . The resist pattern 81 which is formed on the mask sheet base member 80 and the protective film (not shown in the drawing) are removed using a peeling liquid. Accordingly, the member 32 which constitutes the vapor deposition mask 21 is formed. Opening portions 103 for performing the vapor deposition are formed in the member 32.

(E) . . . A predetermined resist pattern 83 is formed on a surface of the mask sheet base member 80 on which the plating layer 82 is not formed. A resist material may be either a dry film or a liquid resist. The resist pattern may be formed using a well-known method. Here, a protective film (not shown in the drawing) made of an organic material may be formed on a surface of the member 32 which is constituted of the plating layer 82. Accordingly, a surface of the member 32 is protected from an etchant in step (F).

(F) . . . The mask sheet base member 80 is formed by spray etching using an etchant containing ferrite chloride as a main component, for example, to form opening portions 84 therein.

(G) . . . The resist pattern 83 which is formed on the mask sheet base member 80 and the protective film (not shown in the drawing) which is formed on the second member 32 are removed using a peeling liquid. Accordingly, the vapor deposition mask 21 shown in FIG. 3 is completed. In the vapor deposition mask 21, the gap space 23 which is defined between the vapor deposition mask 21 and the substrate 101 and the opening portions 103 for forming the vapor deposition pattern are formed.

FIG. 6 is an enlarged cross-sectional view of a panel pattern portion of the display panel similar to FIG. 2 or FIG. 3 for explaining a third constitutional example of a vapor deposition mask. FIG. 6 also enlarges a display panel forming portion in the inside of a vapor deposition mask 21 shown in FIG. 1, that is, a panel pattern portion 24 and shows a structural example in the plate thickness direction of the vapor deposition mask 21.

The vapor deposition mask 21 is constituted of three members, that is, a first member 41, a second member 42 and a third member 43. Although the first member 41 and the second member 42 are selectively made of iron-based alloy such as Invar or 42-alloy, nickel alloy or the like, the combination of materials is selected by taking the specification and formability that the vapor deposition mask is required to satisfy.

The third member 43 is an adhesive agent which fixes the first member 41 and the second member 42 and functions as a barrier layer at the time of preparing a vapor deposition mask by forming the first member 41 and the second member 42. A material which constitutes the barrier layer may be selected depending on a purpose and titanium (Ti), nickel (Ni) or the like may be preferably used.

This constitutional example also can obtain the advantageous effects which are obtained by the example shown in FIG. 3. The advantageous effects obtained by this constitutional example are larger than the advantageous effects obtained by the second constitutional example shown in FIG. 3. Further, by inserting the third member 43 between the first member 41 and the second member 42, it is possible to obtain following advantageous effects.

That is, by imparting a function of a barrier layer to the third member 43, it is possible to ensure the respective forming reliability of the first member 41 and the second member 42 and hence, the selection standard can be alleviated whereby the first member 41 and the second member 42 can be formed using the same material. Further, by forming the vapor deposition opening portion by the third member 43, by forming the gap space 23, for example, by the first member 41, and by using the second member 42 as a reinforcing member of the vapor deposition mask 21, it is possible to obtain the vapor deposition mask 21 which can increase a mechanical strength as a fine pattern.

FIG. 7 is a view for explaining the manufacturing process of the vapor deposition mask having the display panel forming portion 24 shown in FIG. 6. The vapor deposition mask is manufactured in order of steps (A)→(B)→(C)→(D)→(E)→(F)→(G). Although the etching method is used in this manufacturing method, the combination of the etching method and a plating method can be used.

(A) . . . A surface of a mask sheet member 90 which inserts the third member 43 between the first member 41 and the second member 42 is made flat and smooth by polishing. The first member 41 and the second member 42 are made of iron-based alloy such as Invar, 42-alloy. The third member 43 which constitutes an intermediate layer is made of a high-melting-point metal such as titanium (Ti), nickel (Ni) or the like. A plate thickness of the first member 41 is set to 0.005 mm, for example, a plate thickness of the second member 42 is set to 0.015 to 0.050 mm. A plate thickness of the third member 43 is set to 0.001 to 0.01 mm.

(B) . . . A predetermined resist pattern 91 is formed on the second member 42. A resist material may be either a dry film or a liquid resist. In forming the resist pattern, in the same manner as the previously-mentioned method, a well-known method may be used. Here, a protective film (not shown in the drawing) made of an organic material may be formed on a surface of the first member 41. The protective film prevents damages on a protective film forming surface by an etchant in step (C).

(C) . . . The second member 42 is formed by spray etching using an etchant which contains ferric chloride as a main component, for example, thus forming opening portions 92. Here, the third member 43 protects the first member 41 from the etchant.

(D) . . . The resist pattern 91 which is formed on the second member 42 and the protective film (not shown in the drawing) which is formed on the first member 41 are remove using a peeling liquid.

(E) . . . A predetermined resist pattern 93 is formed on the first member 41. A resist material may be either a dry film or a liquid resist. The resist pattern may be formed using a well-known method. Here, a protective film (not shown in the drawing) made of an organic material may be formed on a surface of the second member 42. The protective film prevents damages on a protective film forming surface by an etchant in step (F).

(F) . . . The first member 41 is formed by spray etching using an etchant containing ferrite chloride as a main component. Here, the third member 43 protects the second member 42 from the etchant. Next, the third member 43 is removed using a predetermined etchant. Accordingly, opening portions 94 are formed in the second member 42 and the third member 43.

(G) . . . The resist pattern 93 which is formed on the first member 41 and the protective film (not shown in the drawing) which is formed on the second member 42 are removed using a peeling liquid. Accordingly, the vapor deposition mask 21 shown in FIG. 4 is completed. In the vapor deposition mask 21, a gap space 23 which is formed between the vapor deposition mask 21 and the substrate 101 and opening portions 103 for forming the vapor deposition pattern are formed.

Embodiment 2

Figure 8:
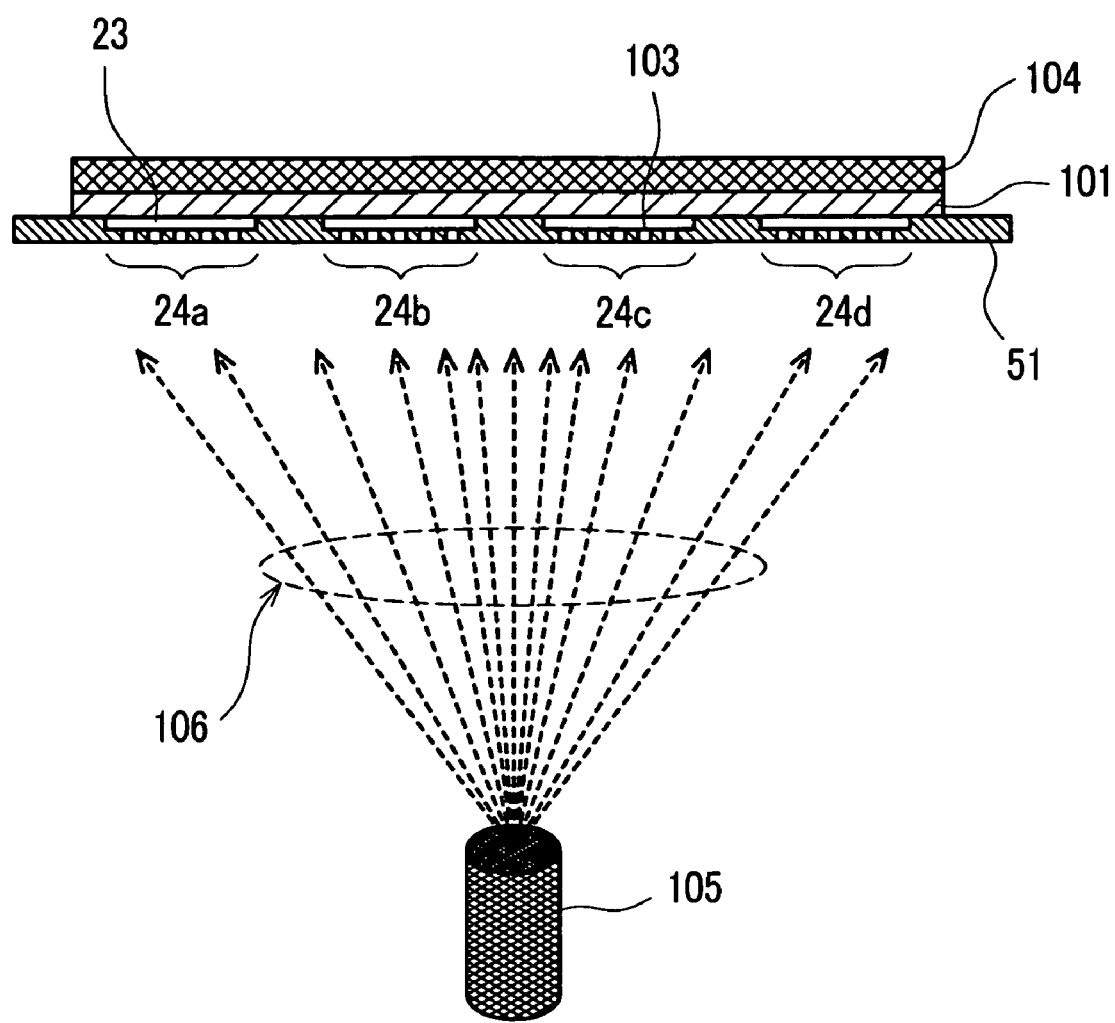
FIG. 8 is a schematic view for explaining an embodiment 2 of the method of manufacturing an organic EL display panel according to the present invention.

FIG. 8 is a schematic view for explaining an embodiment 2 of the method of manufacturing an organic EL display panel according to the present invention. FIG. 8 schematically shows a structural example of a vapor deposition mask and a vapor deposition pattern forming method using the vapor deposition mask in the embodiment 2. Here, a thin film layer which is formed on a vapor deposition mask and a substrate is omitted from the drawing. This embodiment differs from the embodiment 1 with respect to a point that the vapor deposition mask 51 has no mask frame for fixing. This embodiment is substantially equal to the embodiment 1 with respect to other constitutions.

The vapor deposition mask 51 and the substrate 101 are adhered to each other by an attraction force of the magnet 104. Also in this embodiment, a vapor deposition pattern is formed by way of a gap space 23 and hence, this embodiment can obtain advantageous effects substantially equal to the advantageous effects of the embodiment 1. Further, the vapor deposition pattern is not fixed to the mask frame, a technical drawback attributed to the adhesion to the mask frame can be eliminated. The cross-sectional structure in the plate-thickness direction of the vapor deposition mask may adopt any one of the structures shown in FIG. 2, FIG. 3 and FIG. 6.

Since the vapor deposition mask 51 has no mask frame for reinforcing and supporting the vapor deposition mask 51, the vapor deposition mask 51 is required to possess a sufficient strength and to suppress slackening thereof. Accordingly, it is necessary to increase the plate thickness of the vapor deposition mask 51 and hence, the resolution of the vapor deposition mask is slightly lowered compared to the vapor deposition mask of the embodiment 1. However, since the number of parts can be reduced, it is possible to obtain an advantageous effect that a manufacturing cost of the vapor deposition mask can be reduced.

Embodiment 3

Figure 9:
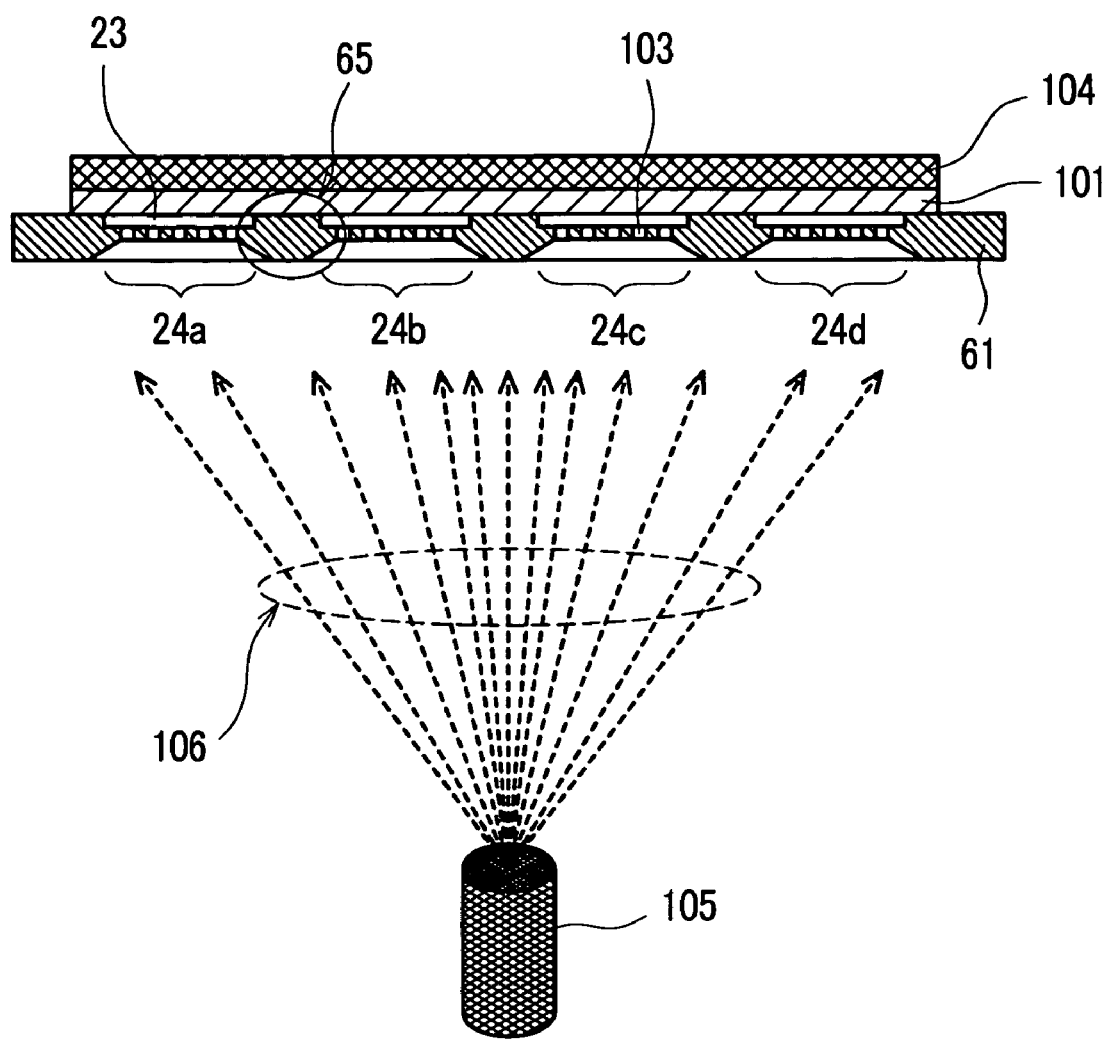
FIG. 9 is a schematic view for explaining an embodiment 3 of the method of manufacturing an organic EL display panel according to the present invention.

FIG. 9 is a schematic view for explaining an embodiment 3 of the method of manufacturing an organic EL display panel according to the present invention. FIG. 9 schematically shows a structural example of a vapor deposition mask and a vapor deposition pattern forming method using the vapor deposition mask in the embodiment 3. Here, a thin film layer which is formed on a vapor deposition mask and a substrate is omitted from the drawing.

This embodiment 3 also differs from the embodiment 1, in the same manner as the embodiment 2, with respect to a point that a vapor deposition mask 61 is not fixed to the mask frame. The vapor deposition mask 61 and the substrate 101 are adhered to each other due to an attraction force of a magnet 104. In this embodiment 3, by increasing a plate thickness of a portion 65 which is adhered to the substrate 101 of the vapor deposition mask 61, it is possible to improve a mechanical strength compared to the embodiment 2. Accordingly, this embodiment can obtain following advantageous effects in addition to the advantageous effects obtained by the embodiment 2.

The embodiment 3 exhibits the higher mechanical strength compared with the embodiment 2. Since the embodiment 3 does not adopt the structure which fixes the vapor deposition mask 61 to the mask frame, it is possible to eliminate a technical drawback attributed to the adhesion to the mask frame. Further, since the number of parts can be reduced, it is possible to obtain an advantageous effect that a manufacturing cost of the vapor deposition mask can be reduced.

Here, it is desirable that the vapor deposition mask 61 adopts the three-layered structure as explained in conjunction with FIG. 6. By allowing the vapor deposition mask 61 to adopt the three-layered structure, by forming opening portions 103 for forming a vapor deposition pattern using the third member 43, by forming a gap space 23 between the substrate 101 and either one of the first member 41 and the second member 42, and by reinforcing the mechanical strength by another one of the first member 41 and the second member 42, this embodiment 3 can obtain following advantageous effects.

It is possible to enhance the resolution of the vapor deposition pattern. It is possible to freely design a distance between the substrate 101 and the vapor deposition mask 61 in the gap space 23. The mask frame can be eliminated. Due to these advantageous effects, this embodiment can largely contribute to the reduction of cost of the mask vapor deposition process.

Embodiment 4

Figure 10:
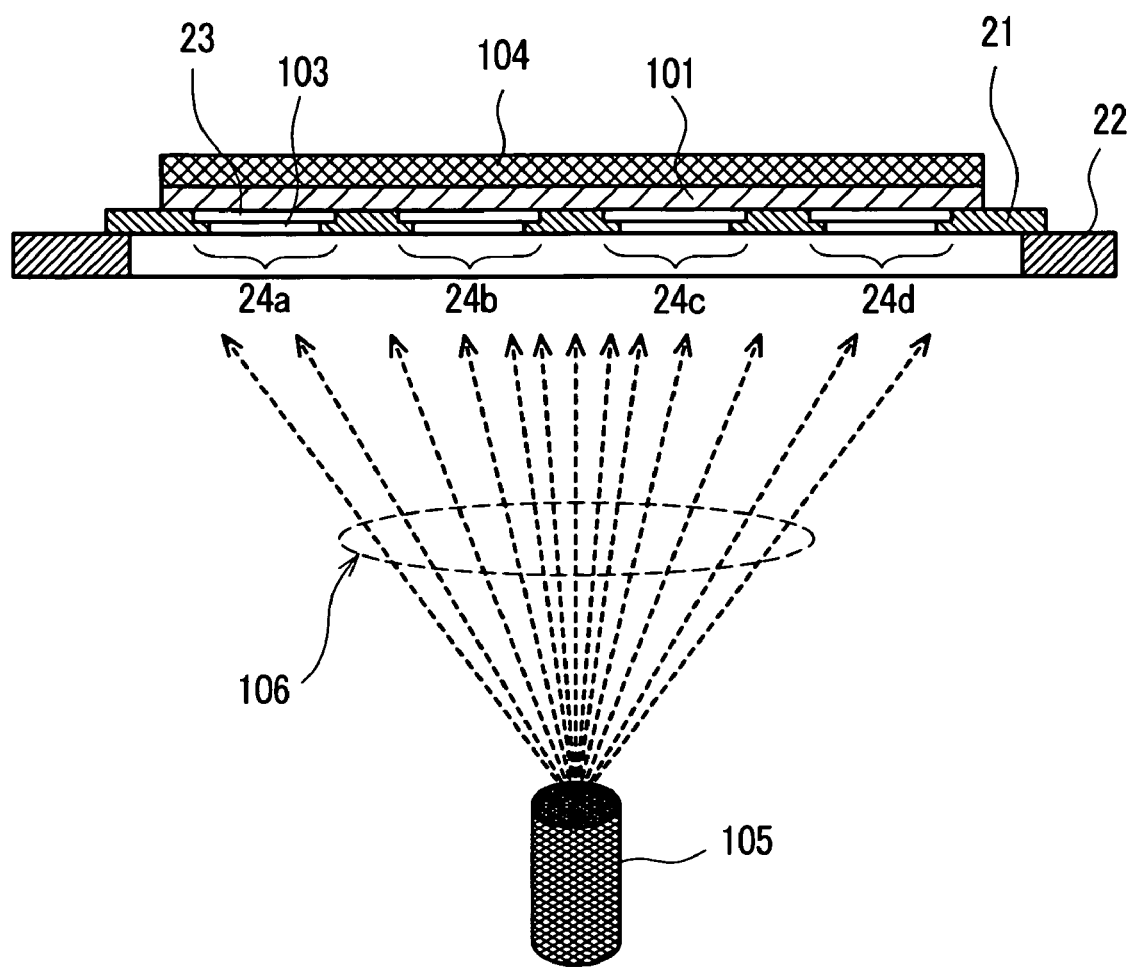
FIG. 10 is a schematic view for explaining an embodiment 4 of the method of manufacturing an organic EL display panel according to the present invention.

FIG. 10 is a schematic view for explaining an embodiment 4 of the method of manufacturing an organic EL display panel according to the present invention. A thin film layer which is formed on a vapor deposition mask and a substrate is omitted from the drawings. Although the embodiment 4 basically has the same structure as the embodiment 1, the embodiment 4 differs from the embodiment 1 with respect to a point that an opening portion 103 for forming a vapor deposition pattern is not formed of fine opening portions but is formed of a large opening portion which corresponds to a panel pattern region 24 (24a to 24d) of each display panel. Although the opening portion 103 is formed slightly narrower than a recessed surface portion which defines a gap space 23, both portions may have the same size. The embodiment 4 is suitable for forming a monochroic OLED film (including an area color) or an electrode film protecting film.

The embodiment 4 is suitable for the formation of a film in a region where dimensional accuracy is not high and can obtain the same advantageous effects as the embodiment 1. Since the substrate 101 and the vapor deposition mask 21 are not brought into contact with each other on a film forming surface, the embodiment 4 is applicable to a sputtering method which exhibits the large influence of charged particles or a chemical vapor deposition method such as a CVD method. In this case, it may be also effective to form a plurality of vapor-deposition-mask inner opening portion 103 by increasing a distance between the substrate 101 and the vapor deposition mask 21 in the gap space 23. Due to such a constitution, the embodiment 4 can expect a shielding effect to the charged particles.

Further, since the high dimensional accuracy is not required, it is possible to increase a thickness of the vapor deposition mask 21, a high mechanical strength can be ensured thus facilitating an operation without a mask frame 22. Further, this constitution also contributes to the reduction of cost. Here, the cross-sectional shape in the plate-thickness direction of the vapor deposition mask 21 may adopt any one of the structures shown in FIG. 2, FIG. 3 and FIG. 6.

Figure 11A:
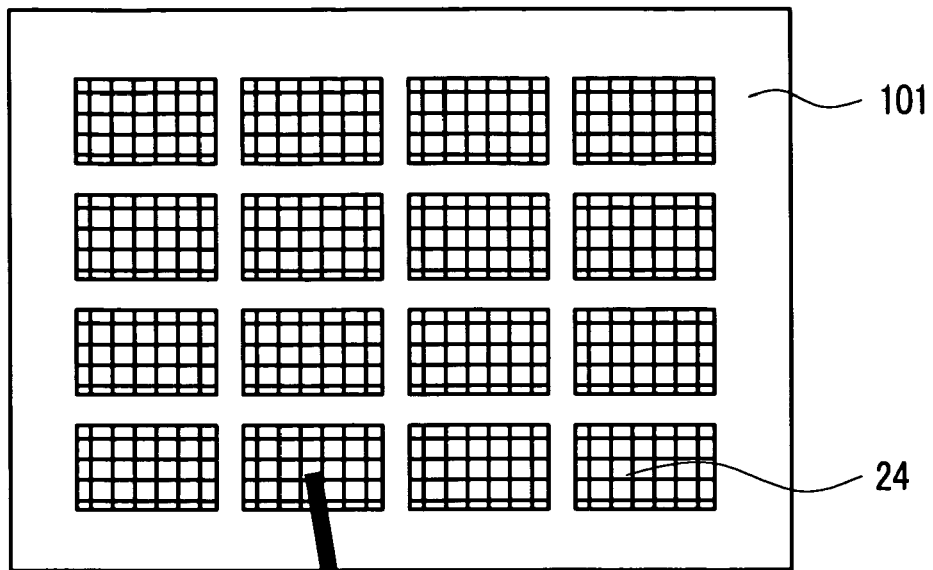
FIG. 11 is a schematic view for explaining one example of an organic light emitting layer of an organic EL display panel to which the vapor deposition mask explained in conjunction with FIG. 1 to FIG. 9 is applied.
Figure 11B:
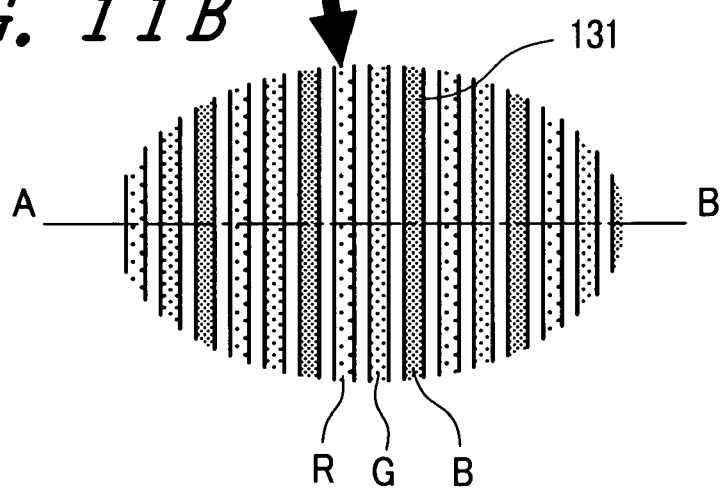
Figure 11C:
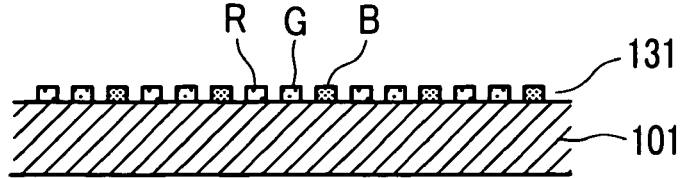

FIG. 11 is a schematic view for explaining one example of an organic light emitting layer of an organic EL display panel to which the vapor deposition mask explained in conjunction with FIG. 1 to FIG. 9 is applied. Here, the drawing shows a state in which a stripe pattern of the OLED which is constituted of red elements R, green elements G and blue elements B is formed on a substrate 101. (A) in FIG. 11 shows a state in which a plurality of display panels 24 are formed on the substrate 101. (B) in FIG. 11 is a partial enlarged view of the display panel 24. The red elements R, the green elements G and the blue elements B of the OLED are formed in a stripe pattern. (C) in FIG. 11 cross-sectional view showing a portion of the display panel 24 shown in (B) in FIG. 11 in an enlarged manner.

The vapor deposition masks which are explained in conjunction with the embodiment 1 to the embodiment 3 are applicable to the mask vapor deposition of organic films 131 such as light emitting layers of the OLED (three-color color separation method). When a distance between the substrate 101 and the vapor deposition mask in the gap space 23 is increased, the periphery of the pattern becomes blurred. Accordingly, it is necessary to determine the distance between the substrate 101 and the vapor deposition mask in the gap space 23 by taking the magnitude or size of this blurring region into consideration.

Figure 12A:
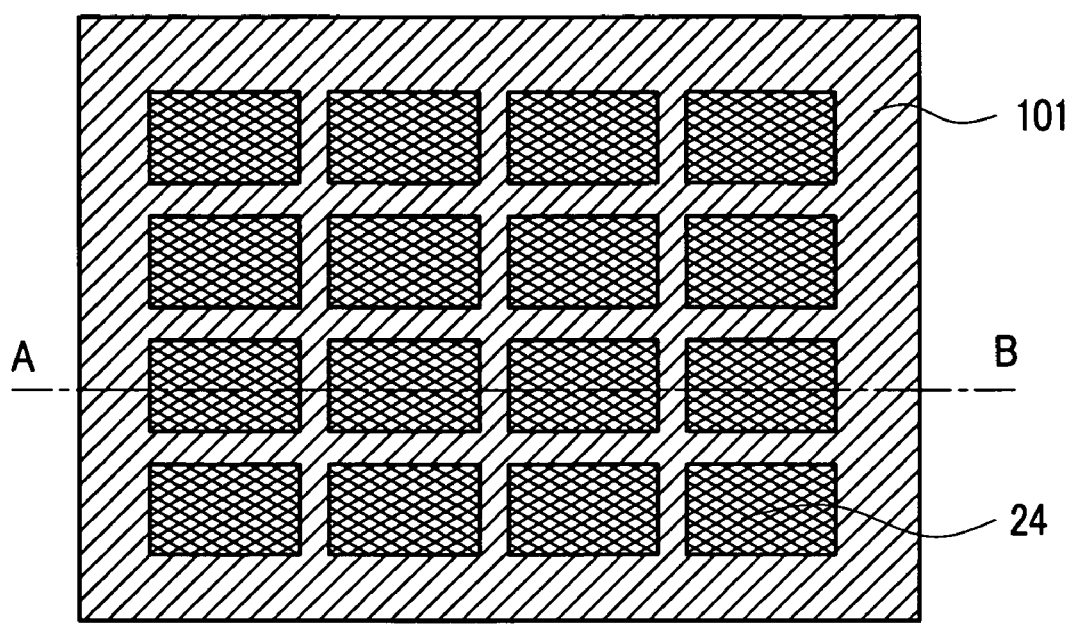
FIG. 12 is a schematic view for explaining one example of an electrode film of the organic EL display panel to which the vapor deposition mask explained in conjunction with the embodiment 4 is applied.
Figure 12B:
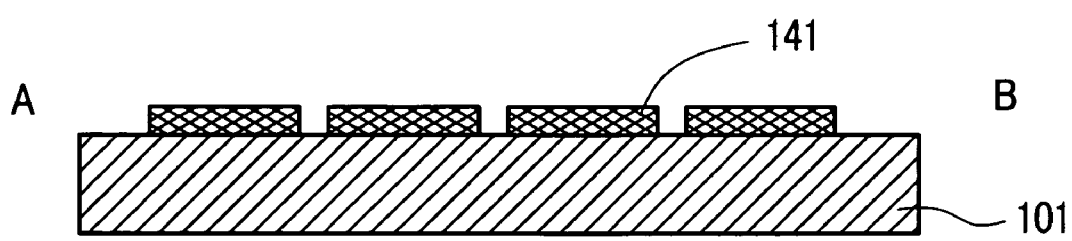

FIG. 12 is a schematic view for explaining one example of an electrode film of the organic EL display panel to which the vapor deposition mask explained in conjunction with the embodiment 4 is applied. Here, electrode films 141 which are made of aluminum (A1) are formed on a substrate 101 by mask vapor deposition. FIG. 12A shows a state in which the electrode films 141 of the display panel are formed on the substrate 101 using the vapor deposition mask explained in conjunction with the embodiment 4. FIG. 12B is a cross-sectional view of the substrate having a vapor deposition pattern of the electrode films 141 along a line A-B in FIG. 12A. The vapor deposition pattern corresponds to an effective region of the display panel. The electrode films 141 are formed of an anode, for example. In this manner, the vapor deposition mask according to the present invention is applicable to the film formation of the OLED electrodes (A1 or the like) and is also applicable to the formation of other films such as the monochroic-pattern OLED films or protective films which are not required to satisfy the pattern accuracy.

Figure 13A:
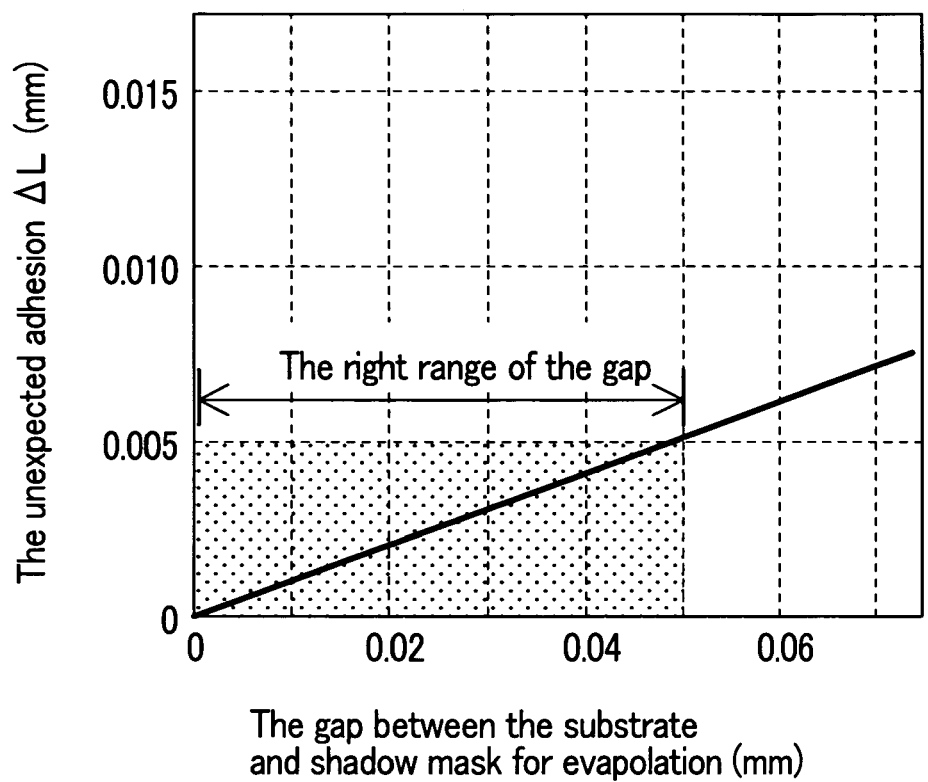
FIG. 13 is a view showing the relationship between a wrap-around quantity ΔL of a thin film layer formed on the substrate to a portion which is covered with the vapor deposition mask and a gap quantity Lg between the substrate and the vapor deposition mask in a gap space.
Figure 13B:
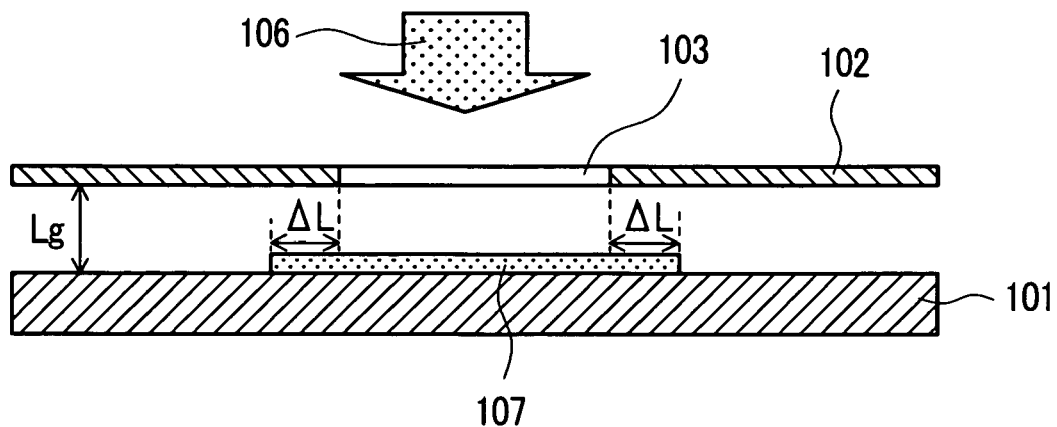

FIG. 13 is a view showing the relationship between a wrap-around quantity (or an unexpected adhesion) ΔL of the vapor deposition layer which is a thin film layer formed on the substrate to a portion which is covered with the vapor deposition mask and a gap quantity Lg between the substrate and the vapor deposition mask in a gap space. In the mask vapor deposition of the present invention, the vapor deposition mask wraps around a portion which is covered with the vapor deposition mask thus forming a vapor deposition mask as a film also on the substrate region where the film should not be formed. This wrap-around quantity ΔL or the unexpected adhesion is, as shown in FIG. 13B, defined as a quantity of the thin film layer 107 which projects from a periphery of the opening portion 103 of the vapor deposition mask 102.

The wrap-around quantity ΔL is, as shown in FIG. 13A, increased along with the increase of the gap quantity Lg between the substrate and the vapor deposition mask in the gap space. Although the wrap-around quantity ΔL is increased approximately proportional to the gap quantity Lg, a gradient of the increase of the wrap-around quantity ΔL can be adjusted based on directivity of an evaporated particle flow from the evaporation source. For example, when a plate thickness of the precision vapor deposition mask is 0.001 to 0.05 mm, with the use of the evaporation source having the high directivity, it is possible to obtain the relationship shown in FIG. 13A.

In the precision vapor deposition mask which forms the fine pattern as in the case of the light emitting layer of the OLED, by setting the gap quantity Lg between the substrate 101 and the vapor deposition mask in the gap space 23 to 0.05 mm or less, it is possible to obtain the highly accurate vapor deposition pattern with small wrap-around quantity ΔL.

It is sufficient for the vapor deposition mask 102 and the substrate 101 provided that these parts are not brought into contact with each other in the gap space 23. To take the influence of the temperature elevation at the time of forming the film or the like into consideration, it is preferable to ensure 0.001 mm as a distance of the gap space 23.

Figure 14:
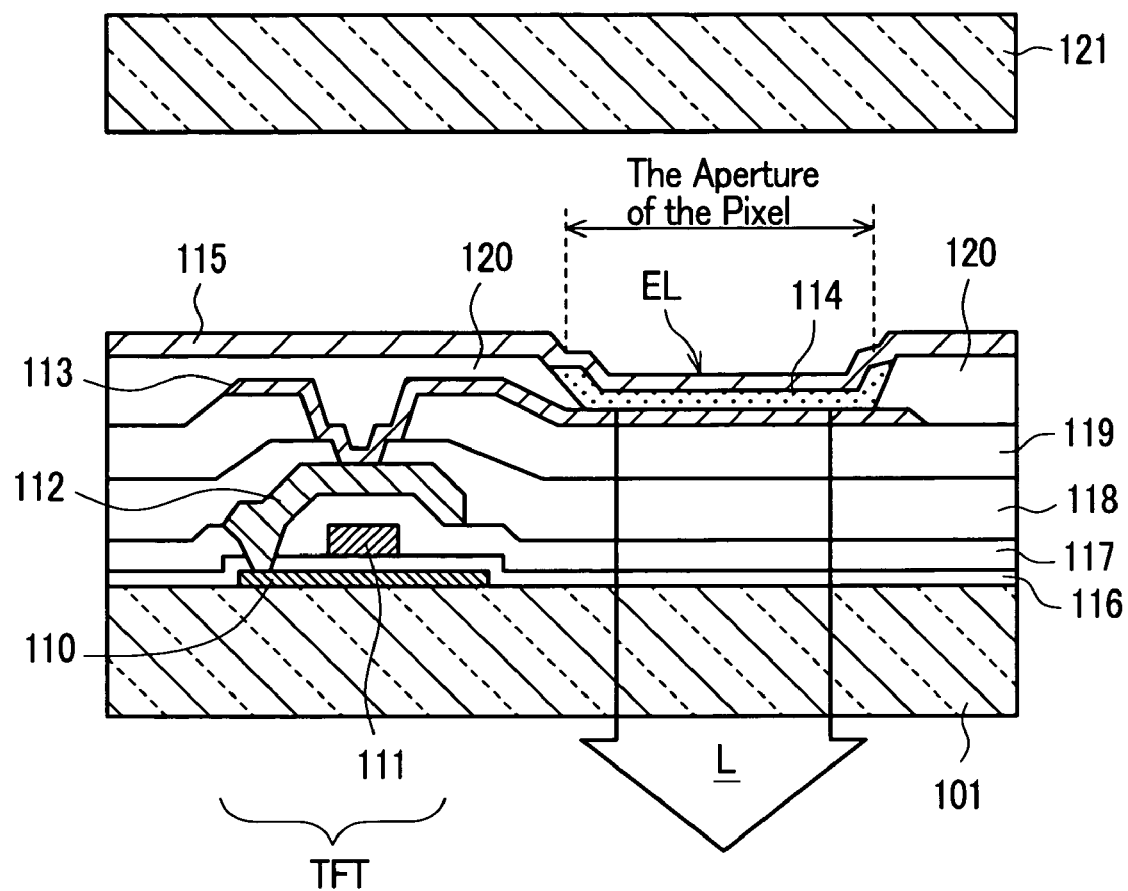
FIG. 14 is a cross-sectional view of the vicinity of one pixel for explaining a constitutional example of the organic EL display panel.
Figure 15:
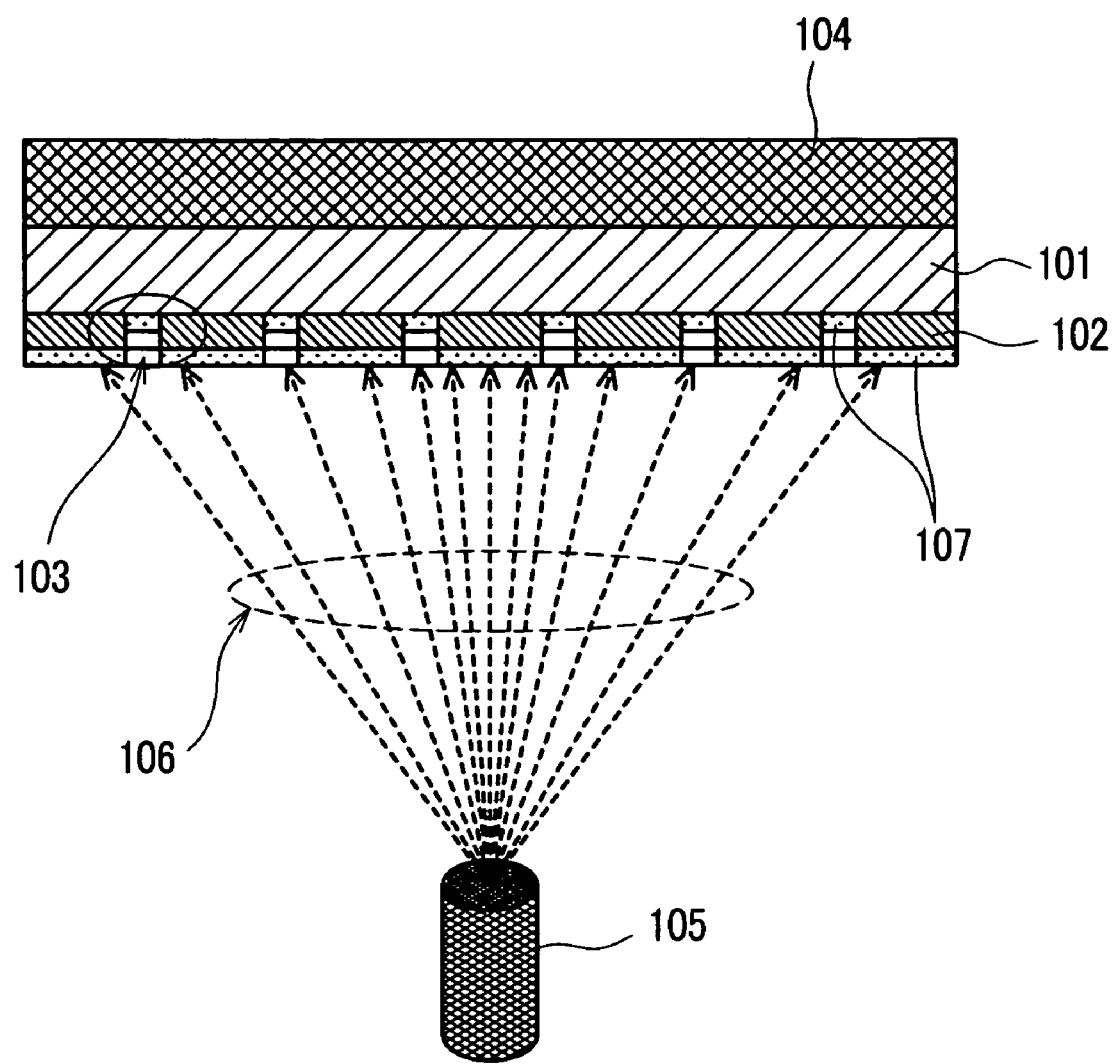
FIG. 15 is a schematic view of a method of manufacturing an organic EL display panel for explaining a method of forming an organic film such as a light emitting layer which uses a vapor deposition mask.

FIG. 14 is a cross-sectional view of the vicinity of one pixel for explaining a constitutional example of the organic EL display panel. This one pixel constitutes a sub pixel in color display. In FIG. 14, on a main surface of the substrate 101 which is preferably made of glass, a thin film transistor TFT which is constituted of a silicon semiconductor layer 110, a gate electrode 111, and a source/drain electrode 112 is incorporated. Although the thin film transistor TFT includes a source electrode and a drain electrode, these electrodes are indicated as the source/drain electrode 112 in the drawing.

To the source/drain electrode 112, an anode 113 which constitutes one electrode of the organic EL element is connected. An insulation layer is formed on the anode 113 and a pixel aperture portion is formed by removing the pixel portion of the insulation layer. The insulation layer which remains while surrounding the pixel aperture portion forms a bank (a projecting bank), and an organic EL light emitting layer 114 is vapor-deposited to the anode 113 which is exposed by removing the insulation layer. Further, a cathode 115 which constitutes another electrode is formed to cover the organic EL light emitting layer 114.

Then, a light emitting element EL is formed of the stacked structure which is constituted of the anode 113, the organic EL light emitting layer 114 and the cathode 115. Here, numerals 116, 117, 118, 119 indicate insulation layers. Numeral 121 indicates a shielding plate. Although the shielding plate 121 is formed of a glass plate, the shielding plate 121 may be formed of a metal can. Further, although a desiccant is incorporated inside the shielding plate 121 to cope with moisture in an organic EL material.

FIG. 14 shows a so-called organic EL display panel of a bottom emission type which radiates light emitted from the organic EL light emitting layer 114 from the substrate 101 side. However, it is apparent that the present invention is not limited to the organic EL having the structure shown in FIG. 14 and is also applicable to a top emission type organic EL which takes out the emission of light from the shielding plate 121 side. The electrode structure and the electrode material of such a case slightly differ from the electrode structure and the electrode material of the bottom emission type EL. The structures of these organic EL display panels are known.

What is claimed is:

1. A method of manufacturing an organic EL display panel in which a vapor deposition mask having a plurality of opening portions in a predetermined pattern is adhered to a surface of a substrate which constitutes an organic EL display panel, and a thin film pattern corresponding to the predetermined pattern is formed on a surface of the substrate through the opening portions of the vapor deposition mask by means of a thin film layer forming means, wherein the plurality of opening portions of the vapor deposition mask are formed in the inside of a recessed surface which is retracted from a surface on which the vapor deposition mask is brought into contact with the substrate, a gap space is formed between the plurality of opening portions of the vapor deposition mask and the surface of the substrate, and the thin film pattern is vapor-deposited by making the plurality of opening portions of the vapor deposition mask spaced apart from the substrate with a predetermined gap, wherein the recessed surface faces the surface of the substrate.

2. A method of manufacturing an organic EL display panel according to claim 1, wherein the gap space which is formed between the recessed surface of the vapor deposition mask used in the formation of the thin film pattern and the substrate is set to 0.001 to 0.05 mm.

3. A method of manufacturing an organic EL display panel according to claim 1, wherein a portion in the plate thickness direction of the vapor deposition mask used for the formation of the thin film pattern which is brought into contact with the substrate is constituted of at least two members or more.

4. A method of manufacturing an organic EL display panel according to claim 1, wherein a thermal expansion coefficient of a material which constitutes a portion of the vapor deposition mask used for the formation of the thin film pattern which is brought into contact with the substrate is set larger than a thermal expansion coefficient of a material which constitutes a portion of the vapor deposition mask which is not brought into contact with the substrate.

5. A method of manufacturing an organic EL display panel according to claim 1, wherein at least one of materials which constitute a portion of the vapor deposition mask used for the formation of the thin film pattern which is brought into contact with the substrate is made of a magnetic material.

6. A method of manufacturing an organic EL display panel according to claim 1, wherein a member constituting a portion of the vapor deposition mask used for formation of the thin film pattern which is not brought into contact with the substrate is made of a non-magnetic material.

7. A method of manufacturing an organic EL display panel according to claim 1, wherein the vapor deposition mask used for formation of the thin film pattern is fixed to and supported on a mask frame.

8. A method of manufacturing an organic EL display panel according to claim 7, wherein the vapor deposition mask used for formation of the thin film pattern is fixed to the mask frame by either one of an adhesive agent and welding.

9. A method of manufacturing an organic EL display panel according to claim 1, wherein the thin film layer forming means is a vacuum vapor deposition method.

10. A method of manufacturing an organic EL display panel according to claim 1, wherein the thin film layer forming means is a sputtering method.

11. A method of manufacturing an organic EL display panel according to claim 1, wherein the thin film layer forming means is a chemical vapor deposition method.

* * * * *